(12) United States Patent
Stirniman et al.

(10) Patent No.: US 6,511,702 B1
(45) Date of Patent: Jan. 28, 2003

(54) APPARATUS AND METHOD TO CONTROL THE MOLECULAR WEIGHT DISTRIBUTION OF A VAPOR

(75) Inventors: Michael Joseph Stirniman, Fremont; Paul Stephen McLeod, Berkeley; Yuh-Jen Cheng, San Jose, all of CA (US)

(73) Assignee: Seagate Technology LLC, Scotts Valley, CA (US)

( * ) Notice: Subject to any disclaimer, the term of this patent is extended or adjusted under 35 U.S.C. 154(b) by 20 days.

(21) Appl. No.: 09/708,504

(22) Filed: Nov. 9, 2000

Related U.S. Application Data
(60) Provisional application No. 60/164,380, filed on Nov. 9, 1999, and provisional application No. 60/197,206, filed on Apr. 14, 2000.

(51) Int. Cl.[7] .............................................. C23C 14/24
(52) U.S. Cl. .................... 427/127; 427/131; 427/248.1; 427/255.6
(58) Field of Search ................................ 427/131, 127, 427/248.1, 255.6

(56) References Cited

U.S. PATENT DOCUMENTS

| | | | |
|---|---|---|---|
| 5,049,410 A | | 9/1991 | Johary et al. |
| 5,049,448 A | | 9/1991 | Ohya et al. |
| 5,098,785 A | | 3/1992 | Yanagita et al. |
| 5,229,899 A | | 7/1993 | Brown et al. |
| 5,266,639 A | | 11/1993 | Chapman, Jr. et al. |
| 5,292,585 A | | 3/1994 | Ohnuki et al. |
| 5,331,487 A | | 7/1994 | Gregory et al. |
| 5,374,683 A | | 12/1994 | Morgan |
| 5,464,904 A | | 11/1995 | Chapman, Jr. et al. |
| 5,468,552 A | | 11/1995 | Ohnuki et al. |
| 5,562,965 A | * | 10/1996 | Gui et al. .................... 428/220 |
| 5,587,217 A | | 12/1996 | Chao et al. |
| 5,636,708 A | | 6/1997 | Wedeven et al. |
| 6,099,896 A | * | 8/2000 | Stirniman .................... 118/50 |

* cited by examiner

*Primary Examiner*—Timothy Meeks
(74) *Attorney, Agent, or Firm*—Morrison & Foerster LLP (57) ABSTRACT

A method and apparatus to provide a substantially steady-state concentration of one or more molecular components, each molecular component having a different vapor pressure, to a vapor deposition chamber. Particularly, the method and apparatus will provide one or more molecular components whose concentration in the vapor deposition chamber, that is, whose weight average molecular weight does not vary with time by more than 50%, preferably by no more than 70%, during deposition of a particular lubricant.

15 Claims, 5 Drawing Sheets

APPARATUS AND METHOD TO CONTROL THE MOLECULAR WEIGHT DISTRIBUTION OF A VAPOR

RELATED APPLICATIONS

This application claims priority from Provisional Application Serial No. 60/164,380 filed Nov. 9, 1999, entitled "Method to control the molecular weight distribution during vapor lubrication," and No. 60/197,206, filed Apr. 14, 2000, entitled "Vapor phase lubricant molecular weight control," the entire disclosures of which are hereby incorporated herein by reference.

FIELD OF THE INVENTION

The present invention relates to a method of controlling the molecular weight distribution of a vapor. Particularly, the invention is directed to a method to control the composition of a lubricant vapor, the lubricant having multiple components with different vapor pressures. The invention is also directed to an apparatus used to control the molecular weight distribution of a vapor.

BACKGROUND

Magnetic discs with magnetizable media are used for data storage in most all computer systems. Current magnetic hard disc drives operate with the read-write heads only a few nanometers above the disc surface and at rather high speeds, typically a few meters per second. Because the read-write heads can contact the disc surface during operation, a thin layer of lubricant is coated on the disc surface to reduce wear and friction.

Lubricants conventionally employed in manufacturing magnetic recording media typically comprise mixtures of long chain polymers characterized by a wide distribution of molecular weights and include perfluoropolyethers, functionalized perfluoropolyethers, perfluoropolyalkylethers (PFPE), and functionalized PFPE. PFPE do not have a flash point and they can be vaporized and condensed without excessive thermal degradation and without forming solid breakdown products. The most widely used class of lubricants include perfluoropolyethers such as AM 2001® or Z-DOL®.

Figure 1:
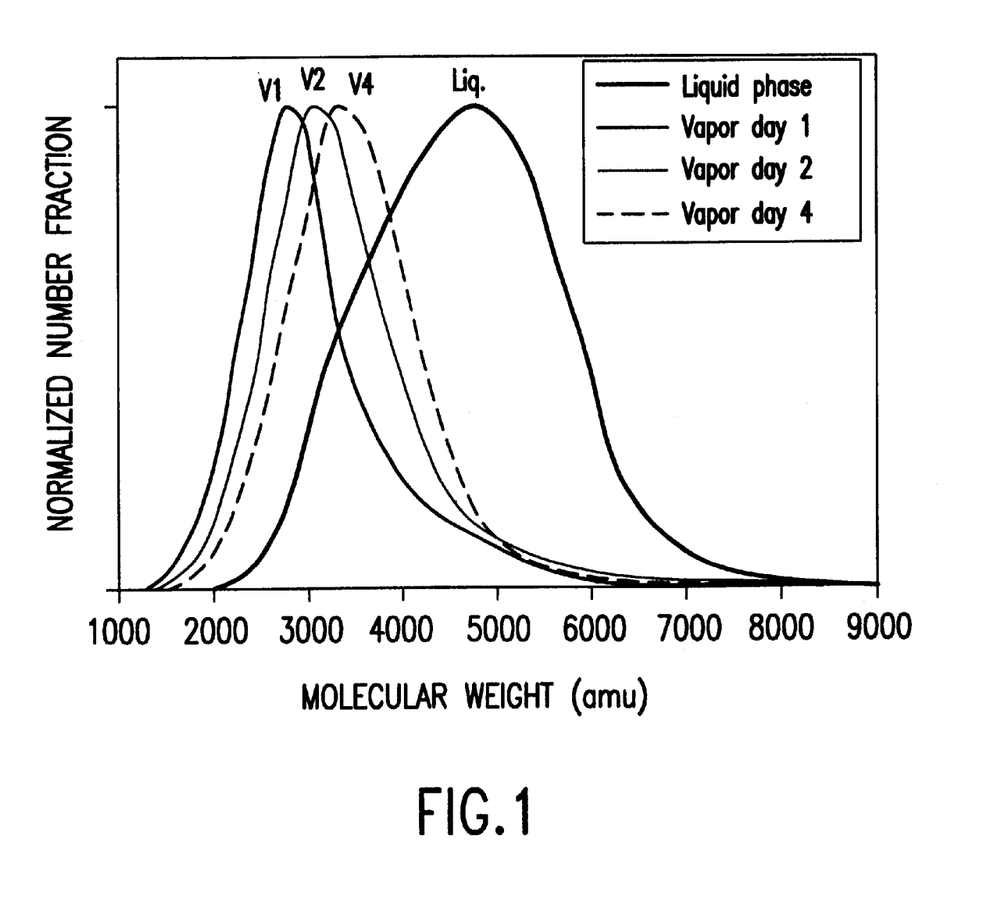
FIG. 1 shows lubricant molecular weight distributions in the vapor phase versus the liquid phase distribution, over four days of continuous vaporization at typical production deposition rates for manufacturing a magnetic recording disc.

During a lubricant vapor lubrication process, the lubricant's vapor phase molecular weight distribution is dependent on the liquid phase distribution and the liquid phase temperature. As the lighter fractions of a polydisperse liquid lubricant are preferentially evaporated, over time the composition of both the liquid phase and vapor phase lubricant is changing. This phenomenon is demonstrated in FIG. 1, which shows lubricant molecular weight distributions in the vapor phase versus the liquid phase distribution, over four days of continuous vaporization at typical production deposition rates. The shift in vapor phase molecular weight over time results in a non-constant and uncontrolled process from disc to disc.

The molecular weight of a lubricant affects the mechanical performance of the interface and, as a consequence, optimal ranges of molecular weight distribution are typically determined for a particular lubricant. Generally, the lubricant is applied to the disc surface by dipping the disc in a bath containing the lubricant. The bath typically contains the lubricant and a coating solvent to improve the coating characteristics of the lubricant which is usually a viscous oil. The discs are removed from the bath, and the solvent is allowed to evaporate, leaving a thin layer of lubricant on the disc surface. However, because the solvent is usually released to the atmosphere, it may raise certain present and future environmental issues. Therefore, an improved process to apply lubricants to recording media without the use of coating solvents is needed.

SUMMARY OF THE INVENTION

The invention utilizes a vapor deposition process to apply lubricants to recording media. The invention provides a substantially steady-state concentration of one or more molecular components of the lubricant to a vapor deposition chamber.

One embodiment is a method for providing a lubricant vapor in a process for manufacturing recording media comprising, adding a lubricant to a device, the lubricant having a plurality of molecular components and a weight average molecular weight $M_l$, each of the molecular components having an associated vapor pressure; vaporizing the lubricant to form the lubricant vapor at a vaporization rate such that the lubricant vapor has a weight average molecular weight $M_v$, wherein the ratio $M_v:M_l$ is from 0.3 to 1 during the process for manufacturing recording media. The method could further comprise depositing the lubricant vapor on a recording medium.

The vaporizing of the lubricant could comprise maintaining a $M_v:M_l$ ratio in a range selected from the group consisting of 0.3 to 0.98, 0.5 to 0.95, and 0.7 to 0.95. The lubricant could be a solid lubricant, a liquid lubricant or mixtures thereof, e.g., polyfluoropolyether. The lubricant could have a $M_w:M_n$ ratio between 1 and 1.6. The lubricant could comprise 70% by weight molecular components having a molecular weight selected from the range consisting of 1 kD to 10 kD, 2 kD to 8 kD, 1 kD to 8 kD, 1 kD to 4 kD, and 2 kD to 4 kD.

In another embodiment, the vaporizing the lubricant could comprise maintaining a vapor phase comprising the lubricant vapor having a weight average molecular weight $M_v$, which does not vary by more than Z percent during the process for manufacturing recording media, wherein Z percent is selected from the group consisting of 10%, 20%, 30%, 40% and 50%.

One embodiment further could comprise providing a carrier gas to transport the lubricant vapor to a recording medium positioned within a vapor deposition chamber.

The device of this invention could comprise two or more heated reservoirs to vaporize the lubricant. The lubricant could be directed from one reservoir maintained at a first temperature to another reservoir maintained at a second temperature. The device could comprise a programmer to control the first temperature and the second temperature and the rate at which the lubricant flows from one reservoir to another reservoir.

One embodiment could comprise providing a line of sight deposition of the lubricant vapor onto a surface of the recording medium. Another embodiment could comprise maintaining the recording medium at a temperature to allow selective condensation of higher molecular weight components from the lubricant vapor.

Another embodiment is a method for providing a lubricant vapor, comprising adding a lubricant to a device, vaporizing the lubricant to form the lubricant vapor, wherein the vaporizing the lubricant comprises maintaining a vapor phase comprising the lubricant vapor having a weight average molecular weight $M_v$ which does not vary by more than Z percent during the process for manufacturing recording media, wherein Z percent is selected from the group consisting of 10%, 20%, 30%, 40% and 50%.

Another embodiment is an apparatus for providing a lubricant vapor in a process for manufacturing recording media, comprising means for adding a lubricant to a device, the lubricant having a plurality of molecular components and a weight average molecular weight $M_l$, each of the molecular components having an associated vapor pressure; and means for vaporizing the lubricant to from a lubricant vapor at a vaporization rate such that the lubricant vapor has a weight average molecular weight $M_v$, wherein the ratio $M_v:M_l$ is from 0.3 to 1 during the process for manufacturing recording media. The means for adding a lubricant could comprise an injector for drop-wise addition of the lubricant to the apparatus for providing the lubricant vapor or a pump for pumping the lubricant into the apparatus. The means for vaporizing the lubricant to form the lubricant vapor could comprise multiple heated reservoirs or a porous tube with multiple heating zones.

In the apparatus, the means of vaporizing the lubricant at a vaporization rate could comprise maintaining a vapor phase comprising the lubricant vapor having a weight average molecular weight $M_v$ which does not vary by more than Z percent during the process for manufacturing recording media, wherein Z percent is selected from the group consisting of 10%, 20%, 30%, 40% and 50%.

The device for controlled vaporization of the lubricant could comprise a porous tube that is variably heated along its length with one or more thermal sources, the lubricant vapor passing through pores on a surface of the tube into a chamber. The porous tube could contain two or more heating zones along its length, the lubricant vapor passing through pores on a surface of the tube into a chamber.

In another embodiment, the device could comprise an injector that adds lubricant to the device such that a substantial proportion of the lubricant is vaporized on contact with a heating zone. The device could comprise an injection nozzle to convert the lubricant to an aerosol.

BRIEF DESCRIPTION OF THE DRAWINGS

The present invention will be better understood by reference to the Detailed Description of the Invention when taken together with the attached drawings, wherein.

DETAILED DESCRIPTION OF THE INVENTION

The invention is directed to a method of coating a substrate, particularly recording media (recording discs), with a lubricant. Lubricants typically contain molecular weight components that range from several hundred Daltons to several thousand Daltons. The molecular components of low molecular weight will have a higher vapor pressure than the high molecular weight components. As a result, heating of the lubricant to produce a lubricant vapor will initially result in a higher proportion of the low molecular weight components in the vapor phase relative to the concentration of that same component in the freshly added lubricant. Therefore, the molecular weight distribution of the vaporized lubricant is generally narrower and of lighter mean molecular weight than the fresh lubricant.

Figure 2:
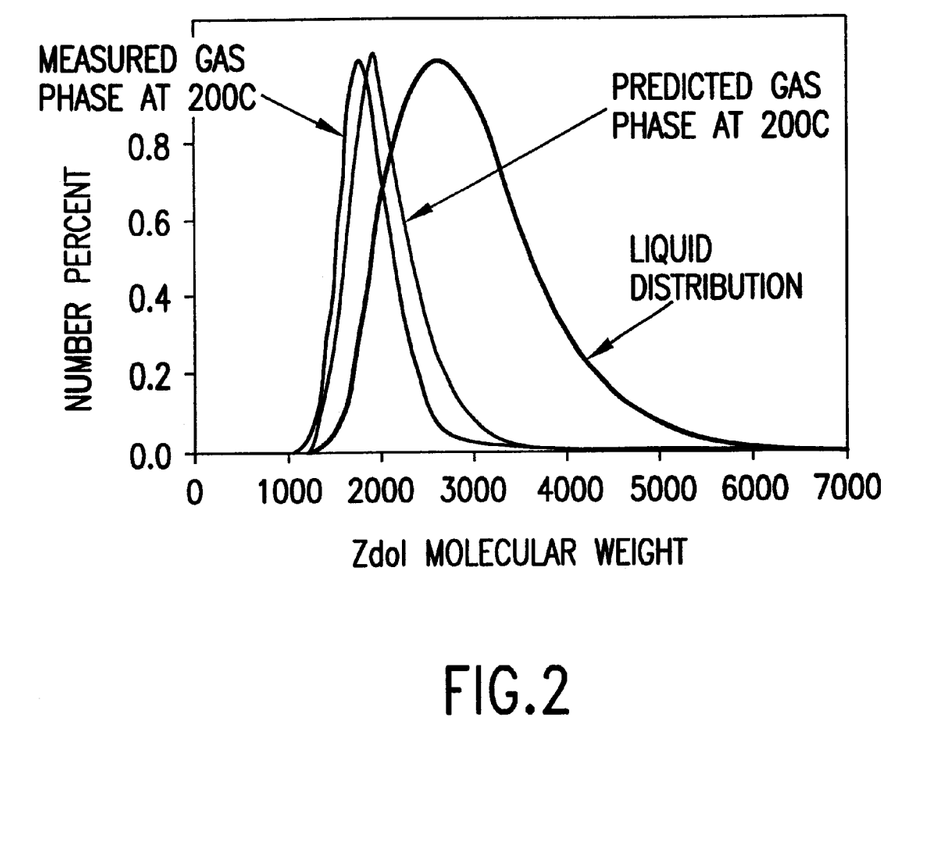
FIG. 2 is a graphical representation of the measured liquid phase and the measured and predicted vapor phase molecular weight distributions for a sample of Fomblin Zdol® PFPE at 200° C.

As an example, FIG. 2 depicts the measured liquid phase and the measured and predicted vapor phase molecular weight for a sample of Fomblin Zdol® PFPE at 200° C. As shown the molecular weight distribution in the vapor phase is significantly narrower than that of the liquid phase and is centered around a peak corresponding to a substantially lower molecular weight. Thus, as Fomblin Zdol® is heated the low molecular weight components will selectively deposit on the recording media. As the deposition proceeds the vapor phase will be represented by higher and higher molecular weight components as the lower molecular weight materials become depleted. These higher molecular weight components will then deposit on the recording media. Consequently, the molecular weight distribution of the lubricant deposited on the disc surfaces is time dependant. A disc in the beginning of the manufacturing process will have a lubricant containing relatively low molecular weight components, and disc toward the end of the manufacturing process will have a lubricant containing relatively high molecular weight components. This non-uniform molecular weight distribution of the deposited lubricant from one disc to another creates a quality control problem. Therefore, a vapor deposition process is needed that will provide a substantially uniform molecular weight distribution of the vapor lubricant during the manufacturing process of the recording media.

The lubricants typically applied to recording media include polyfluoroether compositions that may be terminally functionalized with polar groups, such as hydroxyl, carboxy, or amino. The polar groups provide a means of better attaching or sticking the lubricant onto the surface of the recording media. These fluorinated oils are commercially available under such tradenames as Fomblin Z-Dol®, Fomblin Am2001®, Fomblin Z-DISOC® (Montedison); Demnum® (Daikin) and Krytox® (Dupont).

To provide the lubricant vapor to the recording disc the lubricant, preferably a perfluorinated polyether, is heated, and the lubricant vapor deposits on the surface of the disc in an enclosed environment. Temperatures will generally range from 150° C. to 250° C. to provide deposition times in reasonable accordance with the rest of the disc manufacturing process. The thickness of the lubricant coating should be at least 0.5 nm, preferably at least 1 nm, more preferably at least 1.2 nm and will generally be below 3 nm, preferably in the range from 1 nm to 3 nm. Molecular weight components of particular interest that provide higher film thicknesses range from 1 kD to 10 kD, preferably from 2 kD to 8 kD.

One way of describing a distribution of molecular components of a polymer, i.e., polydispersity, is to compare the weight average molecular weight defined as $$M_w = \Sigma m_i M_i / \Sigma m_i$$

where $m_i$ is the total mass of molecular component in the polymer having a molecular weight $M_i$, with the number average molecular weight defined as $$M_n = \Sigma N_i M_i / \Sigma N_i$$

where $N_i$ is the total number of each molecular component in the polymer having a molecular weight $M_i$. The weight average molecular weight ($M_w$) of a polymer will always be greater than the number average molecular weight ($M_n$), because the later counts the contribution of molecules in each class $M_i$ and the former weighs their contribution in terms of their mass. Thus, those molecular components having a high molecular weight contribute more to the average when mass rather than number is used as the weighing factor.

For all polydisperse polymers the ratio $M_w/M_n$ is always greater than one, and the amount by which this ratio deviates from one is a measure of the polydispersity of the polymer. The larger the $M_w/M_n$ ratio the greater the breadth of the molecular weight distribution of the polymer, that is, the wider the bell shape curves shown in FIG. 2. As shown, the lubricant has a larger $M_w/M_n$ ratio than the lubricant in the vaporized state at 200° C., because only a select proportion of the molecular components in the polymer have an appreciable vapor pressure at this temperature.

In the invention the ratio $M_v:M_l$ is used to define an acceptable deviation between the vapor phase weight average molecular weight ($M_v$) and the weight average molecular weight of fresh lubricant ($M_l$). The term fresh lubricant refers to the lubricant that is added to the device of the invention. In most if not all cases the ratio $M_v:M_l$ will be less than one. Typically, $M_v:M_l$ will be between 0.3 and 1, preferably between 0.5 and 0.95, and more preferably between 0.7 and 0.95.

The lubricant vapors in the deposition chamber will have a substantial steady-state concentration of one or more of the molecular components, each molecular component having a different vapor pressure. As used herein, a substantial steady-state concentration is defined as a concentration of a vapor phase whose weight average molecular weight $M_v$ does not vary with time by more than 50% during the manufacture of recording media. If $(M_v)_h$ and $(M_v)_l$ are the highest and lowest weight average molecular weights of the vapor phase during the manufacture of recording media, then the variation (Z%) in the concentration of the vapor phase is defined as follows:

$$Z=100\times[(M_v)_h-(M_v)_l]/(M_v)_h$$

The molecular weight distribution of the vapor phase can be sampled by condensation of the vapor onto a suitable surface, followed by analysis of the condensate in a calibrated size exclusion chromatography system.

It is also desirable that the fresh lubricant has a relatively narrow molecular weight distribution of molecular components. In practice, the narrower the distribution the easier it will be to maintain a steady-state concentration of one or more components in the vapor. For example, if the highest and lowest molecular weight components in the polymer have very similar molecular weights, their vapor pressures will also be very similar. On the other hand, if the molecular weights (vapor pressures) are dramatically different heating of the lubricant will require much greater temperature and process control for a steady state concentration to be maintained. The lubricant used in the invention should have a $M_w/M_n$ ratio between 1 and 1.6, preferably between 1 and 1.3, more preferably between 1 and 1.2.

The invention can be practiced with any commercial lubricant with a relatively large or small polydispersity, or with a lubricant that has been pre-fractionated to obtain a lubricant with a relatively small polydispersity. The preferred embodiment of the invention does not involve pre-fractionation of the lubricant. However, pre-fractionated lubricants may be used to provide relatively narrow molecular weight lubricant. If a pre-fractionated lubricant is used in the invention, the pre-fractionated lubricant can be obtained by distillation, chromatography, extraction, or other techniques which allow separation by molecular weight.

The invention will be better understood with reference to the following examples, which are intended to illustrate specific embodiments within the overall scope of the invention as claimed.

EXAMPLES

One embodiment of the invention includes at least two lubricant reservoirs with each reservoir heated to different temperatures or temperature ranges during the deposition process to provide a steady state concentration of one or more molecular components in the lubricant vapor. Fresh lubricant is added to the first reservoir which is set at a first temperature. The lubricant that is not vaporized is then directed to a second reservoir which is set at a second temperature. Any number of reservoirs may be used in the invention depending upon the desired deviation in the steady-state concentration of the vapor. Typically, a desire for a higher quality control molecular weight distribution of deposited lubricant will require more reservoirs. The vapor lubricant from each reservoir is then directed to deposition chamber where the lubricant vapor is deposited on the recording media. A mixing chamber or volume can also be used to mix the vapors from each of the reservoirs prior to entering the deposition chamber.

Figure 3:
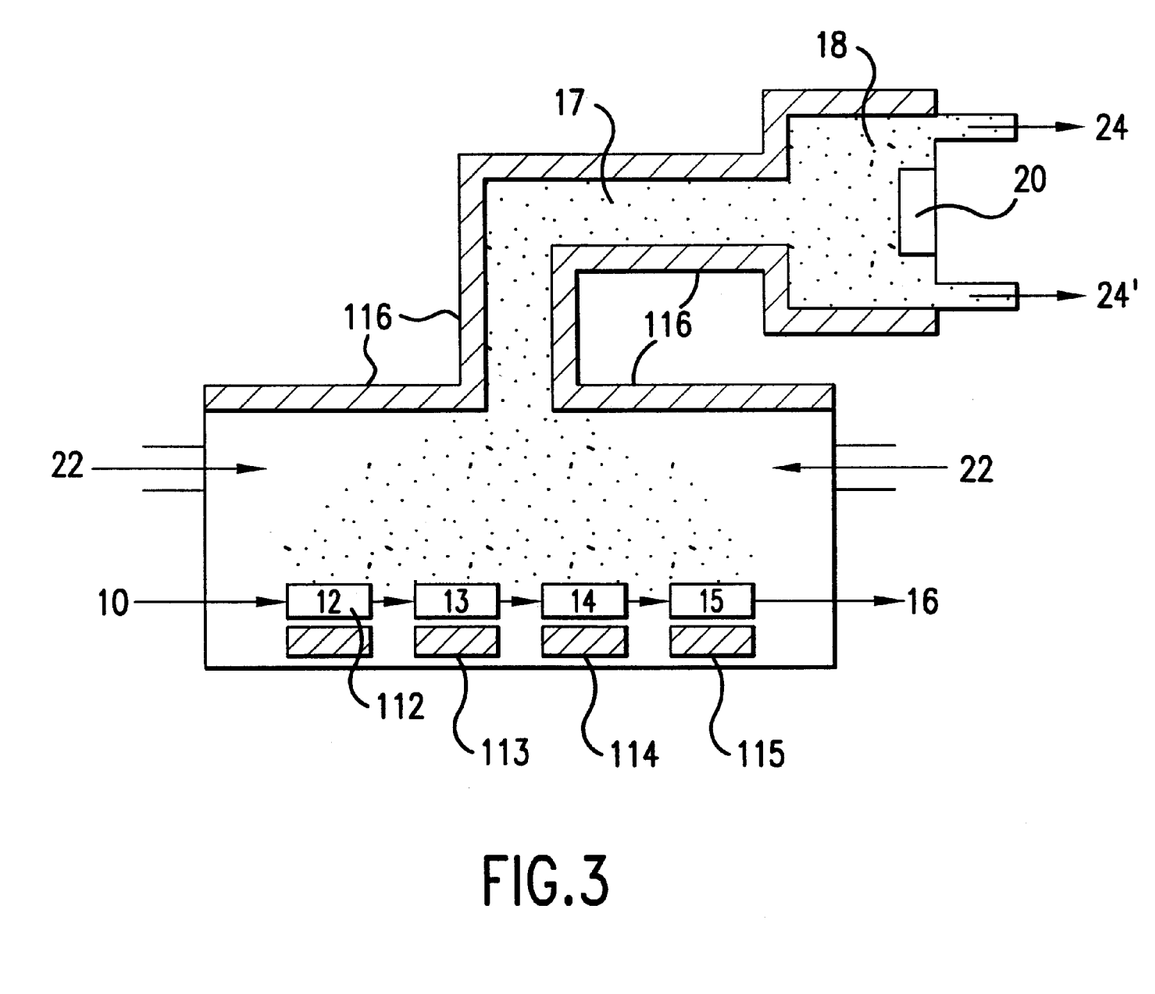
FIG. 3 is a schematic representation of multiple heated reservoirs used to provide a steady-state vapor concentration.

Four reservoirs 12, 13, 14 and 15 and four corresponding heating elements 112, 113, 114 and 115 are shown in FIG. 3 for describing the invention. Each reservoir 12–15 is heated to a set temperature. The vapor lubricant from each reservoir 12–15 is then directed to deposition chamber 18 where the lubricant vapor is deposited on the recording medium 20. A mixing chamber or volume can also be used to mix the vapors from each of the reservoirs 12–15 prior to entering the deposition chamber 18.

In one embodiment, the lubricant vapors from the heated reservoirs 12–15 are directed to a deposition chamber 18, held at or near ambient pressure, using a carrier gas 22. The carrier gas and a portion of the lubricant vapor exit the deposition chamber though exit ports 24, 24'. The exiting gas may be recycled to the device. The carrier gas 22 may contain air, nitrogen, helium, or a mixture thereof.

In another embodiment, the discs are contained in a deposition chamber held at a pressure sufficiently low so as to provide line of sight deposition of the lubricant vapor onto the disc surface. In this case a sufficiently low pressure would mean that the mean free path of the lubricant vapor is greater than the distance of the disc from the vapor source. For typical deposition geometries, a deposition chamber pressure to achieve reasonable mean free paths would be in the range of $10^{-5}$ to $10^{-8}$ mbar.

One embodiment of the invention, which is an example of the line of sight deposition of the lubricant vapor, includes the vapor deposition device described in U.S. Pat. No. 6,099,896, the entire disclosure of which is incorporated herein by reference. The vapor deposition device directs a lubricant vapor through one or more orifices to produce a virtual beam of lubricant vapor. The lubricant vapor is used to coat recording media in one or more select locations. The device can also be used to direct lubricant vapor to the recording media without passing the lubricant through an orifice.

In these embodiments, the disc surface is maintained at a sufficiently low temperature to allow condensation of the lubricant vapor. Alternatively, the disc may be maintained at a temperature to allow selective condensation of higher molecular weight components from the vapor phase.

Fresh lubricant 10 is added to the first reservoir 12. Because the reservoir 12 will typically be set to a relatively low temperature, the molecular components with a low vapor pressure will remain in the lubricant stream and pass on to the subsequent reservoir 13. After a time interval ΔT, the lubricant in each reservoir is directed to the next reservoir, i.e. the lubricant in reservoir 12 is directed to 13, the lubricant in reservoir in 13 is directed to 14, and so on. The lubricant 16 from the last reservoir 15 is disposed of or used in another deposition process. The above step is repeated following every time interval ΔT. The molecular weight distribution of the collected vapor lubricant can be controlled by the temperature settings of the individual heating elements 112–115 and the time interval ΔT. The time interval ΔT can be any number depending on design. Desirably it will be an infinitesimally small number such that the lubricant continually passes from one reservoir to another.

The invention provides a substantially steady-state concentration of one or more molecular components of the lubricant in the vapor state by variably heating the lubricant at various temperatures such that a greater proportion of the molecular components having a relatively low vapor pressure will enter the vapor phase as the lubricant proceeds through the process and contacts the reservoirs set at a higher temperature. For example, as the lubricant passes from 12 to 13 to 14 and heating elements 112 is set less than 113, which is set less than 114 a greater proportion of molecular components having a relatively low vapor pressure will enter the vapor phase for two reasons. One the low molecular weight components are depleted as the lubricant is directed from one reservoir to another. Two, a greater proportion of the molecular components with a low vapor pressure are able to enter the vapor phase due to the higher temperature of the later reservoirs. In effect, a higher proportion of the molecular components with a high vapor pressure enter the vapor phase toward the beginning of the process, e.g., after contacting reservoirs 12 and 13. Similarly, a higher proportion of the molecular components with a low vapor pressure enter the vapor phase toward the end of the process, e.g., after contacting reservoirs 14 and 15. These vapors then mix to form a substantially steady-state concentration of the lubricant vapor.

To maintain the lubricant vapors in the vapor state, the device contains other heating elements 116. These additional heating elements 116 may be positioned in the deposition chamber 18, a mixing chamber, and/or along the channels 17 leading to the deposition chamber 18.

It is to be understood that the temperature of each subsequent reservoir does not necessarily have to be higher than the previous reservoir. In certain cases, it may be necessary to have a subsequent reservoir set at the same or a lower temperature or temperature range than the previous reservoir to obtain a steady-state vapor concentration.

It is to be understood that the invention having multiple reservoirs and multiple heating units associated with each reservoir may include a device whereby the reservoirs are physically directed to stationary heating units in a conveyor belt fashion. As the reservoir leaves the last heating unit the remaining lubricant is discarded or used in another coating process. The reservoir is then eventually returned to the front end of the device, fresh lubricant is added, and the reservoir is returned to the series of heating elements.

Figure 4:
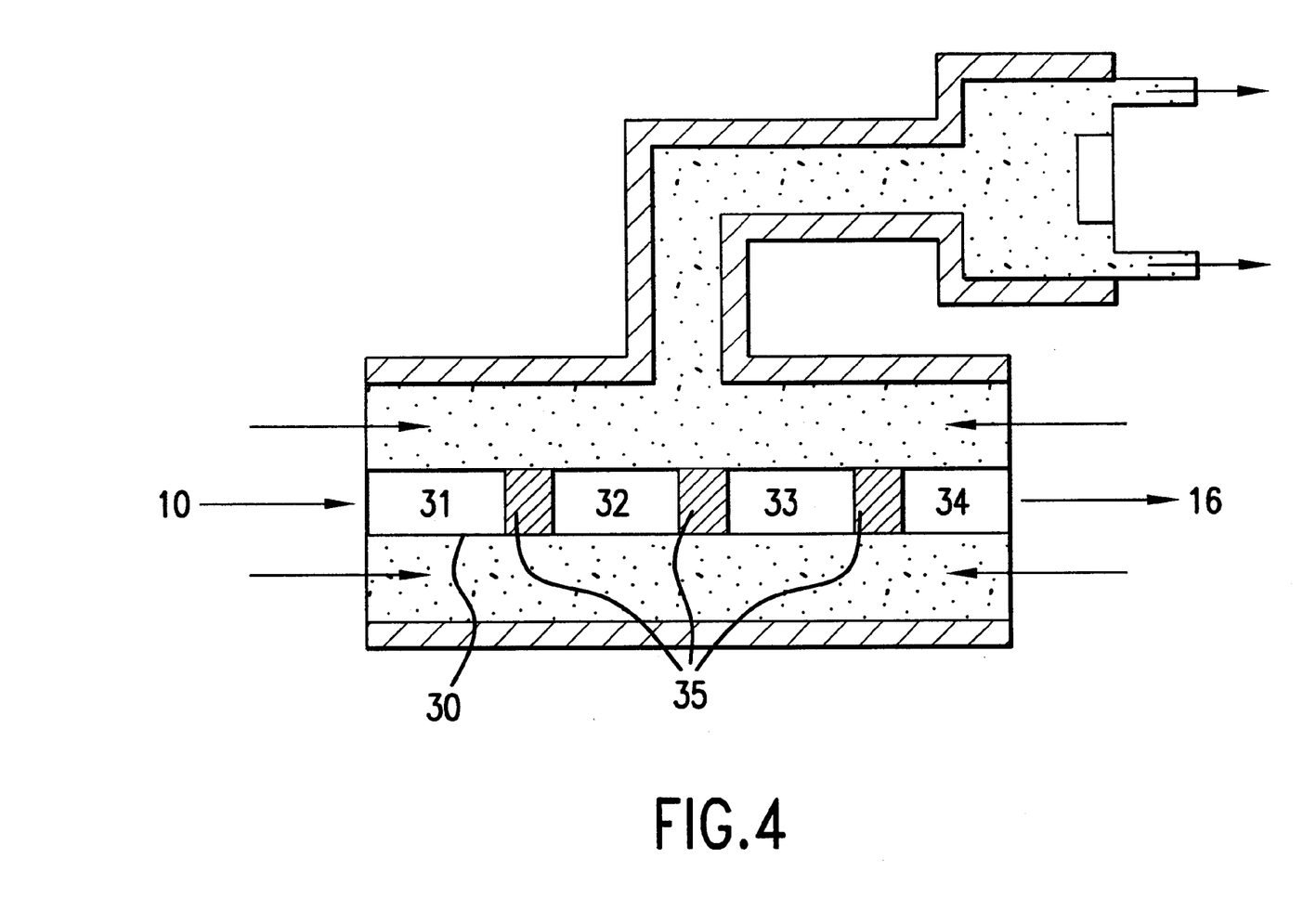
FIG. 4 is a schematic representation of a porous tube with multiple heating zones used to provide a steady-state vapor concentration.

Another embodiment of the invention is depicted in FIG. 4. The device includes a heated, porous tube 30. The tube 30 may be variably heated along its length. Alternatively, the tube may contain distinct heating zones 31, 32, 33 and 34 separated by insulated zones 34. Fresh lubricant 10 is directed to heating zone 31, and spent lubricant 16 exits from heating zone 34. The lubricant is heated in the heating zones 31–34 and the lubricant vapors pass through the pores of the tube.

Each heating zone 31–34 essentially takes the place of the reservoirs 12–15, shown in FIG. 3. For example, as the lubricant passes from zone 31 to zone 32 to zone 33, each zone having a temperature associated with it, a greater proportion of molecular components having a relatively low vapor pressure will enter the vapor phase as the lubricant moves through the tube 30 for two reasons. One, the low molecular weight components are depleted as the lubricant is moves through the tube. Two, a greater proportion of the higher molecular weight components with a low vapor pressure are able to enter the vapor phase due to the higher temperature of the later heating zones. In this case the temperature of the zones on average increase from zone 31 to zone 34. As a result, a higher proportion of the lower molecular weight components with a high vapor pressure enter the vapor phase toward the beginning of the process, e.g., after contacting zone 31 and zone 32. Similarly, a higher proportion of the molecular components with a low vapor pressure enter the vapor phase toward the end of the process, e.g., after contacting zone 34 and zone 35.

It is to be understood that as in the case of the reservoirs, the temperature of each subsequent heating zone does not necessarily have to be higher than the previous heating zone. In certain cases, it may be necessary to have a subsequent heating zone at the same or lower temperature than the previous heating zone to obtain a steady-state vapor concentration.

In still another embodiment, the porous tube may be substituted with a heating plate having a trough or an open, heated tube (not shown) through which the lubricant moves from the front end to the back end of the device. The open heated tube may be variably heated along it length or contain separate heating zones.

In another embodiment, the device may contain a means to add fresh lubricant in relatively small amounts compared to the size or the capacity of the heating zone. In this embodiment the heating zone has a larger enough heat capacity and is maintained at a higher enough temperature to vaporize most if not all of the molecular components in the lubricant over a short time period. In effect, vaporization of most if not all of the molecular components in the lubricant is nearly instantaneous. Therefore, the average molecular weight of the lubricant vapor approximates the average molecular weight of the fresh lubricant.

The fresh lubricant could be added dropwise and directed to a heated surface maintained at a temperature sufficient to vaporize most if not all of the molecular components in the lubricant. Alternatively, the fresh lubricant could be added to the device using a spray injecting system. In this case the lubricant is converted from the liquid to an aerosol. The word "aerosol" means a gaseous suspension of microscopic particles of a liquid and/or a solid. In addition to the microscopic particles of a liquid or a solid, the aerosol could include a gas and/or a vapor.

The aerosol is then injected into a heated chamber maintained at a temperature or temperature range sufficient to vaporize most if not all of the molecular components in the lubricant. The lubricant vapor is then directed to the recording media in a deposition chamber. In either embodiment a carrier gas will typically be used to direct the lubricant vapor to the deposition chamber.

Figure 5:
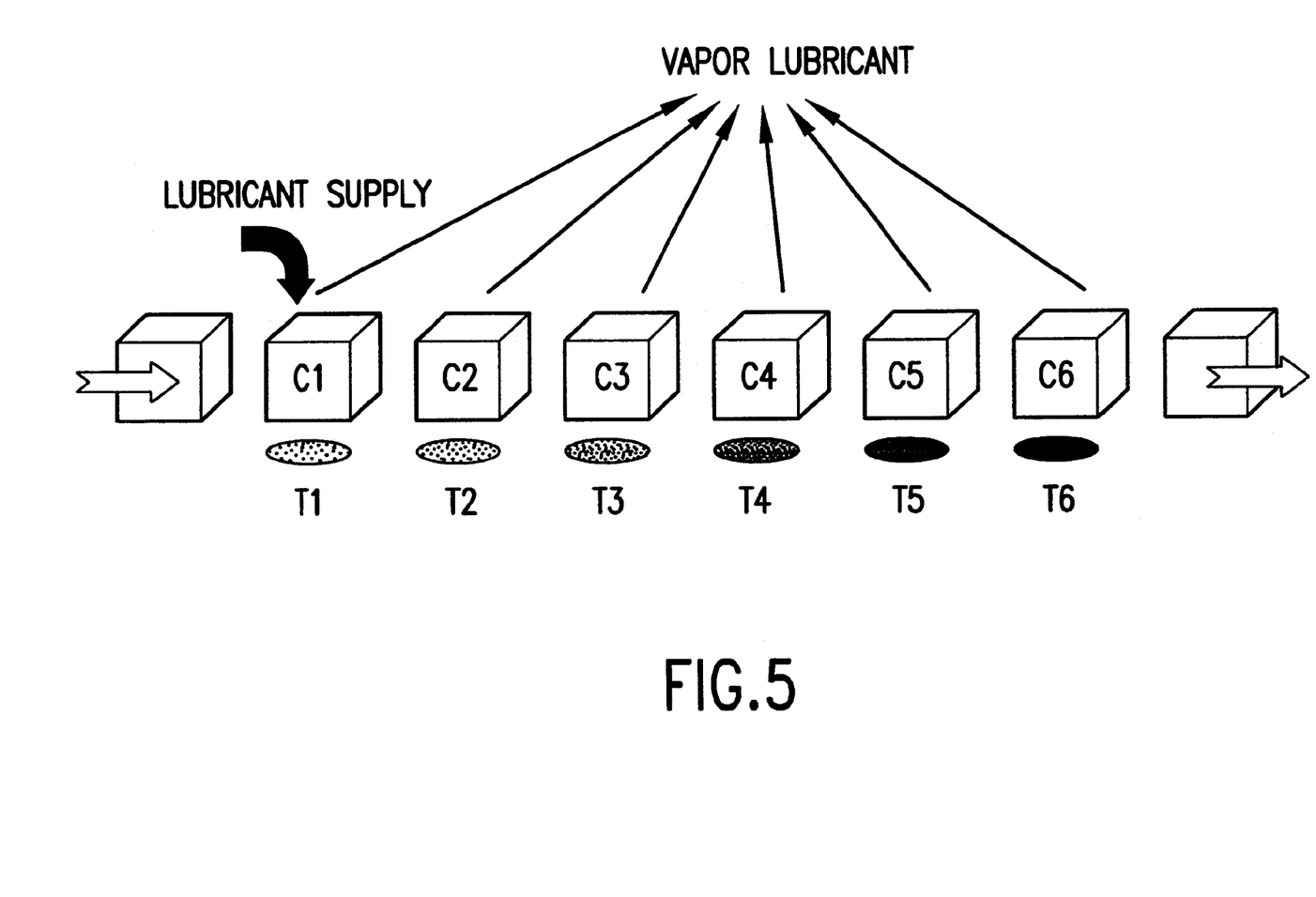
FIG. 5 is an example of a device for producing a controlled molecular weight vapor phase.

A further example is described below with reference to FIG. 5, which shows a device for producing a controlled molecular weight vapor phase. The device consists of several lubricant containers, say at positions C1 to C6. Here, six containers are chosen for illustration purpose only. In real design, it can be any number. Each container sits on a constant temperature heat bath, say temperature ranging from T1 to T6. The vapor lubricant from each container is collected and mixed together for vapor lubricant deposition.

After a time period ΔT, all containers move one step to the next heat bath, i.e. the container at C1 moves into C2, C2 moves into C3, and so on. An empty container moves into C1 position and a fixed amount of liquid lubricant is injected into container C1. The last container, say C6, is disposed (or recycled to C1 position depending on design consideration).

The above step is repeated every time period ΔT. The molecular weight distribution of the collected vapor lubricant can be controlled by the temperature settings for T1 to T6 and the time period ΔT. The time period ΔT can be any number depending on design. It can be an infinitesimally small number such that the containers become moving at constant speed. As a result, the average molecular weight of the lubricant vapor could be adjusted to be the average molecular weight of the fresh lubricant.

Having now fully described this invention, it will be appreciated by those skilled in the art that the invention can be performed within a wide range of parameters within what is claimed, without departing from the spirit and scope of the invention.

What is claimed is:

1. A method for providing a lubricant vapor, comprising:
    adding a lubricant to a device, the lubricant having a plurality of molecular components and a weight average molecular weight $M_1$, and
    vaporizing the lubricant to form the lubricant vapor at a vaporization rate such that the lubricant vapor has a weight average molecular weight $M_v$,
    wherein a $M_v:M_1$ ratio is from 0.3 to 1.

2. The method of claim 1, further comprising depositing the lubricant vapor on a recording medium.

3. The method of claim 1, further comprising providing a line of sight deposition of the lubricant vapor on a recording medium.

4. The method of claim 1, further comprising maintaining a recording medium at a temperature to allow selective condensation of higher molecular weight components from the lubricant vapor on the recording medium.

5. The method of claim 1, further comprising providing a carrier gas to transport the lubricant vapor to a recording medium positioned within a vapor deposition chamber.

6. The method of claim 1, wherein the vaporizing the lubricant comprises maintaining the $M_v:M_1$ ratio in a range selected from the group consisting of 0.3 to 0.98, 0.5 to 0.95, and 0.7 to 0.95.

7. The method of claim 1, wherein the lubricant is a solid lubricant, a liquid lubricant or mixtures thereof.

8. The method of claim 1, wherein the lubricant is a polyfluoropolyether.

9. The method of claim 1, wherein the lubricant has a $M_w:M_n$ ratio between 1 and 1.6.

10. The method of claim 1, wherein the lubricant comprises 70% by weight molecular components having a molecular weight range, wherein the molecular weight range is 1 kD to 10 kD, 2 kD to 8 kD, 1 kD to 8 kD, 1 kD to 4 kD, or 2 kD to 4 kD.

11. The method of claim 1, wherein the device comprises two or more heated reservoirs to vaporize the lubricant.

12. The method of claim 1, wherein the device comprises a porous tube that is variably heated along its length with one or more thermal sources, the lubricant vapor passing through pores on a surface of the tube into a chamber.

13. The method of claim 1, wherein the device comprises an injector that adds lubricant to the device such that a substantial proportion of the lubricant is vaporized on contact with a heating zone.

14. The method of claim 1, wherein the device comprises an injection nozzle to convert the lubricant to an aerosol.

15. A method for providing a lubricant vapor, comprising:
    adding a lubricant to a device,
    vaporizing the lubricant to form the lubricant vapor,
    wherein the vaporizing the lubricant comprises maintaining a vapor phase comprising the lubricant vapor having a weight average molecular weight $M_v$ which does not vary by more than Z percent, wherein Z percent is selected from the group consisting of 10%, 20%, 30%, 40% and 50%.

* * * * *